(12) United States Patent
Chen et al.

(10) Patent No.: US 6,340,638 B1
(45) Date of Patent: Jan. 22, 2002

(54) METHOD FOR FORMING A PASSIVATION LAYER ON COPPER CONDUCTIVE ELEMENTS

(75) Inventors: Jong Chen, Taipei; Tze-Liang Lee; Fan-Keng Yang, both of Hsin-Chu, all of (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/539,936

(22) Filed: Mar. 31, 2000

(51) Int. Cl.[7] ............................................... H01L 21/44
(52) U.S. Cl. ...................... 438/687; 438/637; 438/633; 438/634; 438/675
(58) Field of Search .................................. 438/687–688, 438/617, 637–640, 666, 668, 672, 675, 633–634

(56) References Cited

U.S. PATENT DOCUMENTS

| | | | |
|---|---|---|---|
| 6,090,696 A | * 7/2000 | Jang et al. | 438/617 |
| 6,130,161 A | * 10/2000 | Ashley et al. | 438/687 |
| 6,184,138 B1 | * 2/2001 | Ho et al. | 438/687 |
| 6,200,890 B1 | * 3/2001 | Chen | 438/618 |

FOREIGN PATENT DOCUMENTS

| | | | | |
|---|---|---|---|---|
| JP | 63076455 | * 4/1988 | | |
| JP | 2000012686 | * 1/2000 | ......... | H01L/21/768 |

* cited by examiner

Primary Examiner—Charles Bowers
Assistant Examiner—Thanh Nguyen
(74) Attorney, Agent, or Firm—Tung & Associates

(57) ABSTRACT

A method for forming a passivation layer on at least one copper conductive element in a semiconductor structure and the devices formed are described. In the method, after a top surface of a semiconductor device that contains copper conductors embedded in an insulating layer is first planarized by a chemical mechanical polishing method, an etching process is conducted to create a stepped or corrugated surface between the surface of the copper conductor and the surface of the insulating layer, so that when a passivation layer is later deposited on top of the semiconductor structure, the same stepped or corrugated surface is reproduced in the passivation layer and thus providing a mechanical interlock between the passivation layer and the copper conductor for preventing adhesion failure or peeling of the passivation layer from the surface of the semiconductor structure.

9 Claims, 3 Drawing Sheets

METHOD FOR FORMING A PASSIVATION LAYER ON COPPER CONDUCTIVE ELEMENTS

FIELD OF THE INVENTION

The present invention generally relates to a semiconductor process on copper chips and more particularly, relates to a method for forming a passivation layer on copper conductive elements on a semiconductor chip and devices formed by the method.

BACKGROUND OF THE INVENTION

Copper chips, i.e., semiconductor chips that have copper conductive layer as top metal have been widely used and developed in recent years. One of the most widely used copper applications is the copper interconnect that is formed by either a damascene or a dual damascene process. A typical damascene process and dual damascene process are shown in FIGS. 1 and 2, respectively.

In a single damascene process, shown in FIGS. 1A–1E, a via plug 12 of tungsten is first formed after an oxide layer 14 is planarized by a chemical mechanical polishing process. On top of the IC structure 10 is then deposited, by a plasma enhanced chemical vapor deposition process, an inter-layer-dielectric (ILD) layer 16 of silicon oxide. This is shown in FIG. 1B. Openings 18 for trenches or conductive lines are then patterned by a photoresist layer (not shown) and formed by a reactive ion etching method for metal lines. This is shown in FIG. 1C. In the next step of the process, as shown in FIG. 1D, a conductive metal such as copper is deposited to fill the openings 18 for the trenches or conductive lines. A typical process used for copper deposition can be CVD, electrodeposition or electroless deposition. The copper material 20 covers not only the openings 18 but also on top of the patterned oxide layer 16.

It should be noted that after the via plug 12 process, the ILD layer 14 is deposited without requiring a planarization since the top surface is already flat. The excess metal 20 on top of the ILD layer 16 is then removed by a chemical mechanical polishing process, resulting in a planar structure of a flat top surface 22 that has metal inlays 20, i.e., the copper trenches or copper conductive lines, in the ILD layer 16.

The damascene process provides several processing advantages over the traditional metal/ILD/planarization process. For instance, the surface at any time during the process is totally flat, and the damascene process eliminates the difficulty in filling small gaps between metal lines. Furthermore, the damascene process eliminates the difficultly in metal etching, particularly in hard-to-etch metal such as copper. While damascene process provides numerous benefits, it is more complex and requires a via plug process and a CMP process for both the metal and the ILD layer. Morever, the damascene process requires a flat topography to start out with in order to form subsequent flat surfaces.

A more frequently used process for forming copper conductors in a back-end-of-line (BEOL) process is shown in FIGS. 2A–2C. In the dual damascene process, vias and trenches are defined by using two separate lithographic and reactive ion etching steps. However, the via plug is filled in the same deposition step as the metal line. Dual damascene process reduces the number of processing steps by reducing the barrier layer depositions from two to one and by eliminating the CVD tungsten plug deposition process. A further benefit achieved in the dual damascene process is that the via plug is formed of the same conductive metal as the metal line and thus eliminating the risk of via electromigration failure.

As shown in FIG. 2A, the semiconductor structure 30 is built with metal conductive lines 32 formed in an ILD layer 34 which is then planarized to form a flat top surface 36 with a photoresist layer 38 deposited and patterned thereon. Openings 40 are formed by the patterning process to provide locations for next level metal lines to be formed. After the formation of the opening 40, the photoresist layer 38 is stripped and then a second photoresist layer 42 is applied on top of the IC structure 30. Via pattern is then defined and a via opening 44 is formed by a reactive ion etching process. This is shown in FIG. 2B.

In the next step of the dual damascene process, as shown in FIG. 2C, a conductive metal such as copper is deposited to fill both the via opening 44 and the trench opening 40 after the second photoresist layer 42 is first removed. The conductive metal deposition process can be carried out by either a CVD process, an electrodeposition process or an electroless deposition process. The novel step for the dual damascene process allows the via 46 and the trench 48 to be formed of the same conductive metal, such as copper. After the metal deposition process, excess metal (not shown) is removed by a CMP process to provide a smooth top surface 50.

After the copper damascene or dual damascene interconnects are formed, and insulating material layer, i.e., or a passivation layer of a dielectric material must be deposited on top of the IC structure in order to provide electrical insulation. This is shown in FIGS. 3A–3C. As copper trench 20 (or 48 shown in FIG. 2C) of FIG. 1 is used as the top metal conductor by the damascene or dual damascene process, the top surface 50 is planarized into a flat surface, as shown in FIG. 3A. A diffusion barrier layer 52 is then deposited on top of the surface 50 to protect copper trench 20 from diffusing into the subsequently deposited passivation layer 54, as shown in FIGS. 3B and 3C. The passivation layer 54 in the copper trench 20 has a wide flat contact which presents an adhesion failure problem, i.e., or a peeling problem. The wider the flat surface, the greater potential it has to cause peeling from the flat structure.

The adhesion between copper and dielectric materials such as silicon oxide, polyimide etc. is poor. While methods have been proposed to improve the adhesion of copper to the dielectric layer, such as by treatment of the interface or by using adhesion-promoting films, none of these methods is effective when a wide flat area between copper and dielectric layer of a passivation material is involved. The passivation layer 54 is normally formed of an undoped silicate glass (USG) or a spin-on-glass (SOG) material. When the adhesion-promoting film layer is used, the film layer must also be a diffusion barrier layer in order to stop diffusion of copper atoms into the dielectric material layer, and thus, only the use of adhesion layers which are also good barriers, can be of any practical value.

In the conventional method of using AlCu metal which contains a small amount of copper as the top metal layer, there is a design rule for assembly stress protection. The design rule is used to avoid passivation layer peeling at a wide flat area. However, when pure copper is used as the top metal layer, there is no design rule that can be used to protect the layer from assembly stress, specifically, at a wide flat area. There is a great potential of passivation layer peeling at such area.

It is therefore an object of the present invention to provide a method for forming a passivation layer on copper conductive elements that does not have the drawbacks or shortcomings of the conventional methods.

It is another object of the present invention to provide a method for forming a passivation layer on copper conductive elements that does not have passivation layer peeling or adhesion failure problem.

It is a further object of the present invention to provide a method for forming a passivation layer on copper conductive elements with improved adhesion between copper and the passivation layer over a wide flat area.

It is another further object of the present invention to provide a method for forming a passivation layer on copper conductive elements after a CMP process by creating a corrugated surface between the copper and the passivation material layer.

It is still another object of the present invention to provide a method for forming a passivation layer on copper conductive elements that does not have the adhesion failure problem by etching a top surface of the semiconductor device in a dry etching step forming is corrugated surface between the copper conductors and the passivation layer.

It is yet another object of the present invention to provide a method for forming passivation layer on copper conductive elements by wet etching a top surface of the semiconductor device to remove a top layer of the copper conductors thus forming a corrugated interface between the copper and the passivation layer.

It is still another further object of the present invention to provide a semiconductor structure that has at least one copper conductive element embedded in an insulating layer and covered by a passivation layer that includes a stepped surface between the copper conductive element and the insulating material surrounding the copper conductive element.

It is yet another further object of the present invention to provide a semiconductor structure that has at least one copper conductive element embedded in an insulating layer by forming a corrugated interface between the copper conductors and the surrounding insulating layer such that a mechanical interlock between them is achieved for improving adhesion.

SUMMARY OF THE INVENTION

In accordance with the present invention, a method for forming a passivation layer on copper conductive elements and devices formed by the method are disclosed.

In a preferred embodiment, a method for forming passivation layer on at least one copper conductive element in a semiconductor structure can be carried out by the operating steps of first providing a semiconductor device that has at least one copper conductive element embedded in a first insulating layer, planarizing a top surface of the semiconductor device to expose the at least one copper conductive element in the first insulating layer, etching the top surface of the semiconductor device for forming a first stepped surface between the at least one copper conductive element in the insulating layer, and depositing conformally a second insulating layer on top of the semiconductor device forming a second stepped surface substantially similar to the first stepped surface, wherein the first and second stepped surfaces provide an interlock between the at least one copper conductive element and the top insulating layer thus avoiding peeling of the second insulating layer from the top surface of the semiconductor device.

In the method for forming passivation layer on at least one copper conductive element in a semiconductor structure, the first insulating layer may be formed of silicon oxide, the second insulating layer may be a passivation layer, or a passivation layer formed of undoped silicate glass or spin-on-glass. The method may further include the step of etching the top surface of the semiconductor device by a wet etching method for removing a surface layer of the at least one copper conductive element. The method may further include the step of removing a layer between about 0.1 $\mu$m and about 0.5 $\mu$m of the at least one copper conductive element. The method may further include the step of etching the top surface of the semiconductor device by a dry etching method for removing a surface layer of the first insulating layer, or the step of depositing a diffusion barrier layer on the top surface of the semiconductor device prior to the deposition step for the second insulating layer. The diffusion barrier layer deposited may be a silicon nitride layer. The dry etching of the first insulating layer stops at an etch stop layer. The method may further include the step of planarizing the top surface of the semiconductor device by a chemical mechanical polishing method.

The present invention is further directed to a semiconductor structure that has at least one copper conductive element embedded in an insulating layer that includes a pre-processed semiconductor substrate that has at least one copper conductive element in an insulating layer, a stepped surface formed between the at least one copper conductive element and the insulating later surrounding the at least one copper conductive element, and a passivation layer on top of the semiconductor structure encapsulating the at least one copper conductive element and the first insulating layer reproducing the stepped surface in a top surface of the passivation layer wherein the stepped surface provides interlocking between the passivation layer and the at least one copper conductive element to prevent peeling of the passivation layer from the semiconductor structure.

In the semiconductor structure that has at least one copper conductive element embedded in an insulating layer, the at least one copper conductive element is at least one copper interconnect. The stepped surface is formed by the at least one copper conductive element protruding above the insulating layer, or formed by the insulating layer protruding above the at least one copper conductive element. The first insulating layer may be an inter-layerdielectric material of silicon oxide, the passivation layer may be formed of USG or SOG. The semiconductor structure may further include a diffusion barrier layer inbetween the passivation layer and the insulating layer/the at least one copper conductive element. The structure may further include an etch stop layer on top of the insulating layer after the insulating layer is etched by a dry etching method forming the stepped surface. The diffusion barrier layer may be a silicon nitride layer that has a thickness of at least 50 Å.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENTS

Figure 1A:
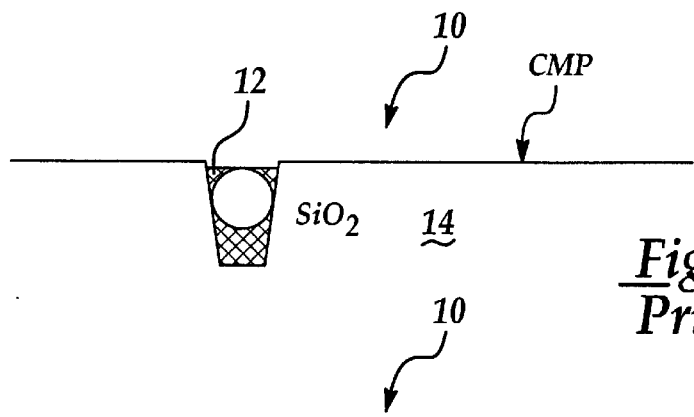
FIG. 1A, is an enlarged, cross-sectional view of a semiconductor structure that has a metal via formed in a planarized oxide layer.
Figure 1B:
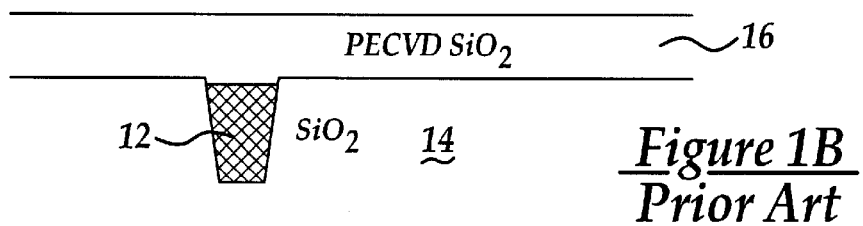
FIG. 1B is an enlarged, cross-sectional view of the semi-conductor structure of FIG. 1A having an inter-level-dielectric material deposited on top.
Figure 1C:
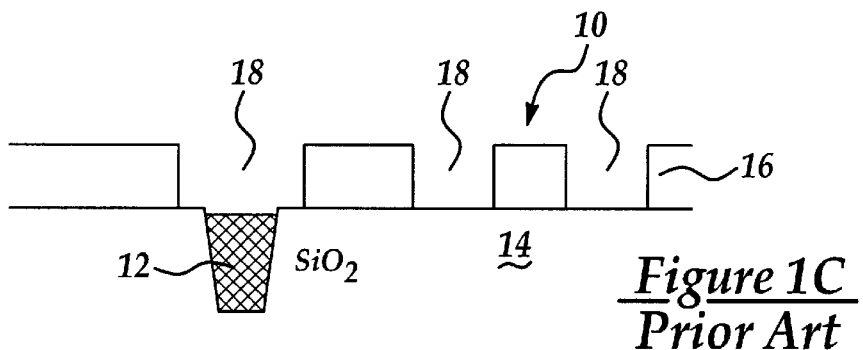
FIG. 1C is an enlarged, cross-sectional view of the semiconductor of FIG. 1B with the ILD layer patterned for trench openings.
Figure 1D:
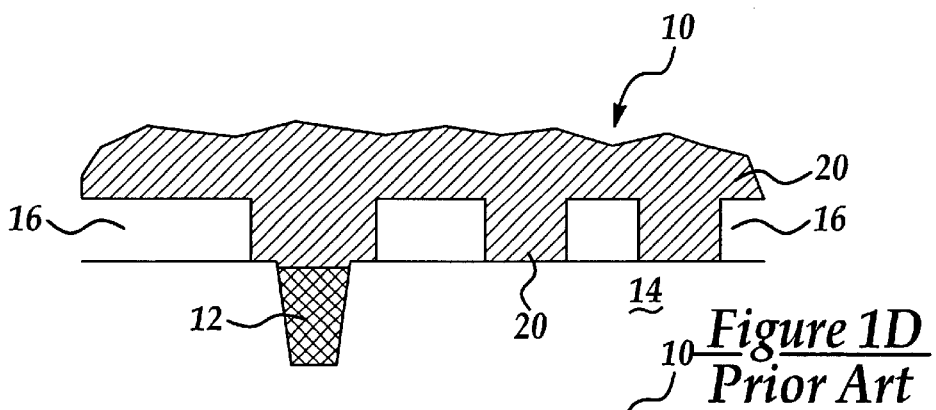
FIG. 1D is an enlarged, cross-sectional view of the semiconductor structure of FIG. 1C with the trench openings filled with a conductive metal.
Figure 1E:
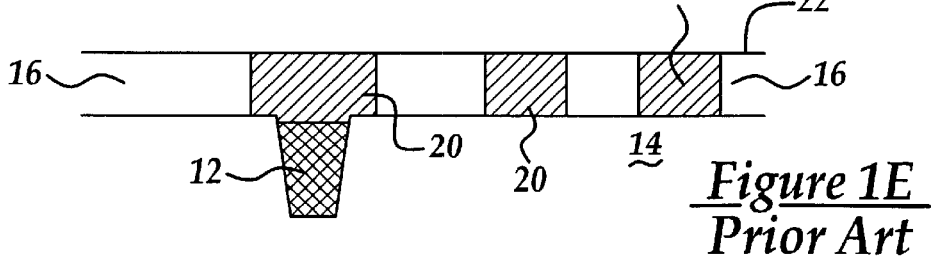
FIG. 1E is an enlarged, cross-sectional view of the semiconductor structure of FIG. 1D with the top planarized to provide a flat surface exposing both the metal trenches and the ILD layer.
Figure 2A:
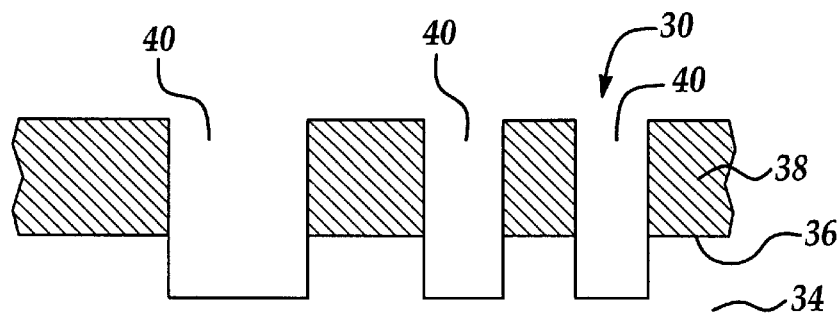
FIG. 2A is an enlarged, cross-sectional view of the semiconductor structure with a photoresist layer deposited and patterned on top in a damascene process.
Figure 2B:
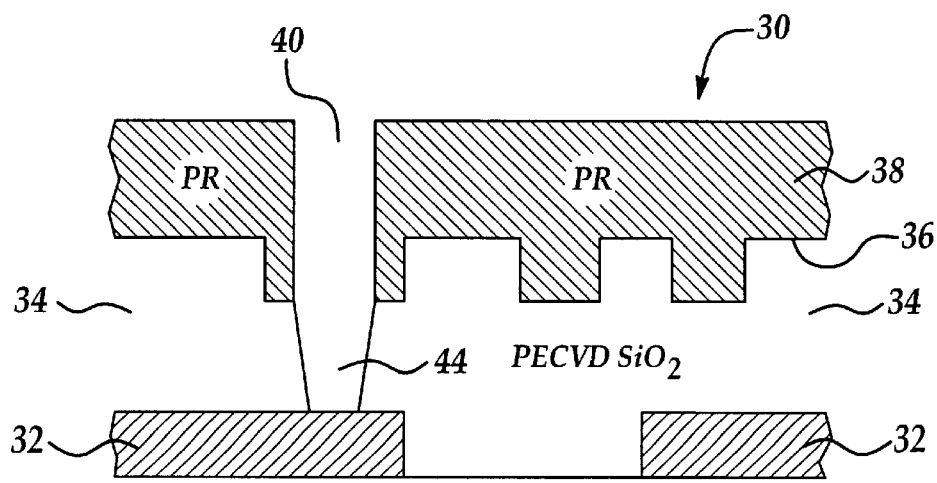
FIG. 2B is an enlarged, cross-sectional view of the semiconductor structure of FIG. 2A with a via opening formed by a second photoresist layer.
Figure 2C:
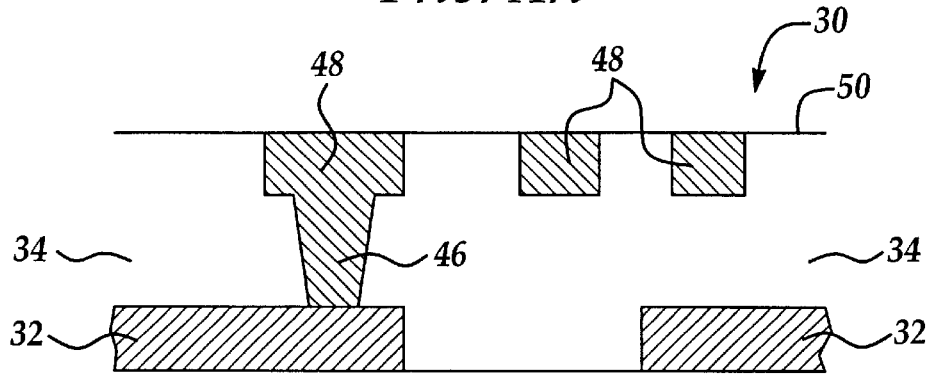
FIG. 2C is an enlarged, cross-sectional view of the semiconductor structure of FIG. 2B with the via and trench openings filled with a conductive metal and the top surface planarized by a CMP method.
Figure 3A:
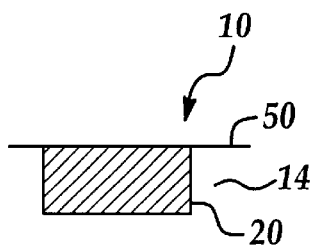
FIG. 3A is a conventional semiconductor structure prepared by a damascene process with a flat top surface.
Figure 3B:
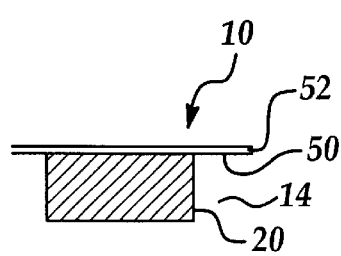
FIG. 3B is an enlarged, cross-sectional view of the semiconductor structure of FIG. 3A with a diffusion barrier layer deposited on top.
Figure 3C:
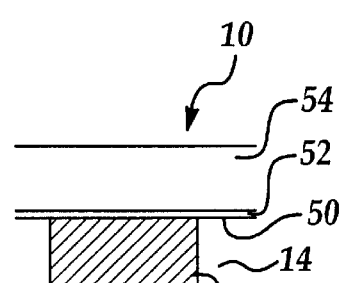
FIG. 3C is an enlarged, cross-sectional view of the semiconductor structure of FIG. 3B with a passivation layer deposited on top of the diffusion layer barrier.

The present invention discloses a method for forming a passivation layer on copper conductive elements, such as copper lines or trenches, with improved adhesion between the passivation layer and the copper for preventing peeling in a wide flat area. The present invention is further directed to a semiconductor structure that has at least one copper conductive element embedded in an insulating layer and a passivation layer deposited on top wherein the passivation layer is interlocked with the at least one copper conductive element such that peeling defect of the passivation layer is eliminated.

In the present invention novel method, a semiconductor device is first provided which has at least one copper conductive element, such as copper lines or trenches embedded in a first insulating layer such as an inter-layer-dielectric material of oxide. The top surface of the semiconductor device is then planarized by a chemical mechanical polishing method to expose the at least one copper conductive element in the first insulating layer, or the first ILD layer. An etching process is then conducted to either etch away a surface layer of the copper conductor or a surface layer of the first insulating layer. When the surface layer of the copper conductor is to be etched (or removed), a wet dipping method in acid can be advantageously used. When the surface layer of the ILD layer is to be removed, a dry etching method such as a reactive ion etching technique is used to remove the oxide material. Either one of the etching methods will produce a stepped surface, or a corrugated structure between the top surface of the copper conductor and the top surface of the ILD layer. When the wet dipping method is used, the top surface of the ILD layer is higher than the top surface of the copper conductor. To the contrary, when the dry etching method is utilized, the top surface of the copper conductor is higher than the top surface of the ILD layer. After the etching process is completed, i.e., by either the dry etching or the wet etching technique, a second insulating layer, i.e., a passivation layer is deposited on top of the semiconductor structure to form a second stepped surface that is substantially similar to the first stepped surface formed between the top surface of the copper conductor and the top surface of the ILD layer. The stepped surface therefore provides an interlock between the passivation layer and the copper conductors or the surrounding ILD layer thus preventing peeling of the passivation layer from the top surface of the semiconductor surface. As previously discussed, such peeling defect is frequently seen in wide flat area in a passivation layer deposited on copper chips after a chemical mechanical polishing process.

The present invention further discloses a semiconductor structure that has at least one copper conductive element embedded in an insulating layer and covered by a passivation layer on top of the structure. A stepped surface, or a corrugated structure is formed between the passivation layer and the at least one copper conductive element to provide an interlocking effect and thus preventing peeling of the passivation layer even in a wide flat area.

Figure 4A:
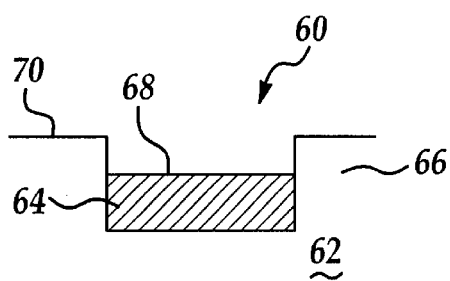
FIG. 4A is an enlarged, cross-sectional view of the present invention semiconductor structure with a top layer of the copper conductor etched away in a wet etching process.
Figure 4B:
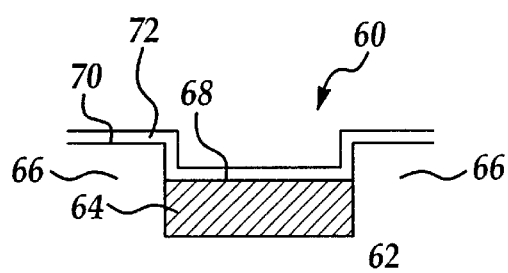
FIG. 4B is an enlarged, cross-sectional view of the semiconductor structure of FIG. 4A with a diffusion barrier layer deposited on top conforming to the stepped structure.
Figure 4C:
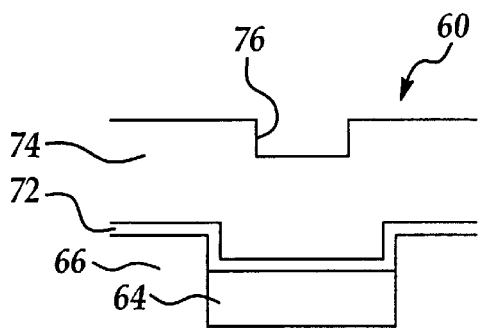
FIG. 4C is an enlarged, cross-sectional view of the semiconductor structure of FIG. 4B with a passivation layer deposited on top conforming to the stepped surface.

Referring now to FIGS. 4A, 4B and 4C which shows a first preferred embodiment of the present invention novel method. As shown in FIG. 4A, a present invention semiconductor structure 60 is provided which precludes a pre-processed semiconductor substrate 62 with a copper conductor 64 formed in an ILD layer 66 of oxide. The semiconductor structure 60 has been dipped in a wet etching process to etch away a surface layer on the copper conductor 64 and thus providing a recessed surface 68 from the top surface 70 of the ILD layer 66. The copper conductor 64 has a thickness of at least several microns, i.e., in the range of between about 1 $\mu$m and about 3 $\mu$m. The recess from the top surface 70 of the ILD layer 66 for the copper conductor is between about 0.1~0.5 $\mu$m. A suitable wet etching process, or wet dipping process can be conducted in an acid or in a diluted acid solution such as acetic acid, or any other suitable acid. The etch rate can be suitably controlled by the concentration of the acid solution, the dipping time and the temperature of the dipping solution.

After the stepped surface between 68 and 70 is formed, as shown in FIG. 4B, a diffusion barrier layer 72 for the copper conductor 64 is deposited on top of the semiconductor device 60. A suitable diffusion barrier material for copper is silicon nitride or any other barrier material. The thickness of the silicon nitride layer can be suitably selected between about 100 Å and about 500 Å. In the final step of the present invention novel method, as shown in FIG. 4C, a passivation layer 74 is deposited on top of the diffusion barrier layer 72. It is to be noted that the stepped surface between 68 and 70 is reproduced not only in the diffusion barrier layer 72, but also in the passivation material layer 74 as evidenced by step 76 shown in FIG. 4C. The stepped surface between surfaces 68,70 provides a mechanical interlock between the passivation layer 74 and the ILD layer 66 and thus preventing any adhesion failure, or peeling of the passivation layer 74 from the top surface of the semiconductor surface 60. A suitable passivation material can be an undoped silicate glass (USG) or a spin-on-glass (SOG) material. The passivation layer is conformally deposited onto the diffusion barrier layer 72.

Figure 5A:
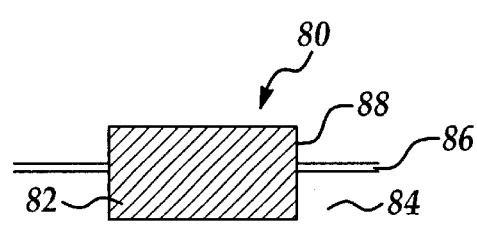
FIG. 5A is an enlarged, cross-sectional view of the present invention semiconductor structure with the ILD layer etched by a dry etching method to the etch stop layer.
Figure 5B:
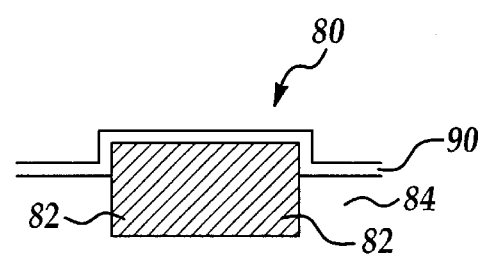
FIG. 5B is an enlarged, cross-sectional view of the semiconductor structure of FIG. 5A with a diffusion barrier layer deposited on top conforming to the stepped surface.
Figure 5C:
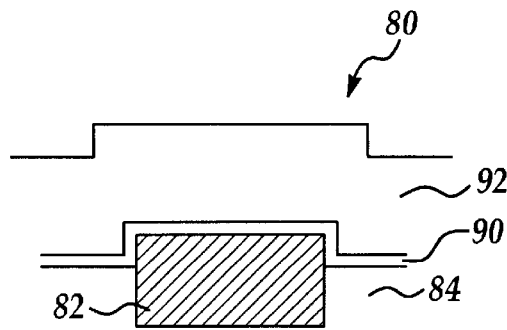
FIG. 5C is an enlarged, cross-sectional view of the semiconductor structure of FIG. 5B with a passivation layer deposited on top conforming to the stepped surface.

In a second preferred embodiment of the present invention novel method, as shown in FIGS. 5A, 5B and 5C, a present invention semiconductor structure 80 is provided which has a copper conductor 82 embedded in ILD layer 84. In this embodiment, in order to control the dry etching step by the reactive ion etching method for removing the top surface of the ILD layer 84, an etch stop layer 86 is provided prior to the dry etching process. The etch stop layer can be suitably a silicon nitride layer, or any other layer that is resistant to etchant gas used in the reactive ion etching process. FIG. 5A shows an enlarged, cross-sectional view of the present invention semiconductor structure 80 after the dry etching process with the copper conductor 82 protruding above the ILD layer 84 and thereby creating a stepped surface 88. A suitable etchant gas for etching silicon oxide includes $CF_4$ and other saturated and unsaturated fluorocarbons or hydro-fluorocarbons. The copper conductor 82 effectively functions as a hard mass and is substantially not effected by the dry etchant.

In the second step of the present invention method, a diffusion barrier layer 90 for protecting copper conductor from diffusing into the passivation layer is conformally deposited on top of the ILD layer 84 and the copper conductor 82. This is shown in FIG. 5B. A thick passivation layer 92 of at least 1 $\mu$m thick is then conformally deposited on top of the diffusion barrier layer 90. The stepped surface 88 is thus reproduced in the diffusion barrier layer 90 and in the passivation layer 92 for providing a mechanical lock between the passivation layer 92 and the copper conductor 82.

It should be noted that in the first preferred embodiment shown in FIGS. 4A–4C and in the second preferred embodiment shown in FIGS. 5A–5C, a stepped surface or a corrugated structure between the passivation layer and the copper conductor is formed to provide a mechanical interlock between them. The same interlocking function can be achieved by either wet etching away a copper layer or dry etching away an oxide layer.

The present invention novel method and device formed by the method have therefore been amply described in the above description and in the appended drawings of FIGS. 4A–5C.

While the present invention has been described in an illustrative manner, it should be understood that the terminology used is intended to be in a nature of words of description rather than of limitation.

Furthermore, while the present invention has been described in terms of two preferred embodiments, it is to be appreciated that those skilled in the art will readily apply these teachings to other possible variations of the inventions.

The embodiment of the invention in which an exclusive property or privilege is claimed are defined as follows:

What is claimed is:

1. A method for forming passivation layer on at least one copper conductive element in a semiconductor structure comprising the steps of:

providing a semiconductor device having at least one copper conductive element embedded in a first insulating layer;

planarizing a top surface to expose said at least one copper conductive element in said first insulating layer;

dry etching said top surface of the semiconductor device removing a surface layer of said first insulating layer stopping at an etch-stop layer, said dry etching step forms a first stepped surface between said at least one copper conductive element and said first insulating layer; and depositing conformally a second insulating layer on top of said semiconductor device forming a second stepped surface substantially similar to said first stepped surface, wherein said first and second stepped surfaces provide an interlock between said at least one copper conductive element and said first and second insulating layers thus avoiding peeling of said passivation layer from said top surface of the semiconductor device.

2. A method for forming passivation layer on at least one copper conductive element in a semiconductor structure according to claim 1, wherein said first insulating layer is formed of silicon oxide.

3. A method for forming passivation layer on at least one copper conductive element in a semiconductor structure according to claim 1, wherein said second insulating layer is a passivation layer.

4. A method for forming passivation layer on at least one copper conductive element in a semiconductor structure according to claim 1, wherein second insulating layer is a passivation layer formed of undoped silicate glass (USG) or spin-on-glass (SOG) material.

5. A method for forming passivation layer on at least one copper conductive element in a semiconductor structure according to claim 1, for conforming the step of etching said top surface of the semiconductor device by a wet etching method for removing a surface layer of at least one copper conductive element.

6. A method for forming passivation layer on at least one copper conductive element in a semiconductor structure according to claim 5 further comprising the step of removing a layer between about 0.1 $\mu$m and about 0.5 $\mu$m of said at least one copper conductive element.

7. A method for forming passivation layer on at least one copper conductive element in a semiconductor structure according to claim 1 further comprising the step of depositing a diffusion barrier layer on said top surface of the semiconductor device prior to said deposition step for said second insulating layer.

8. A method for forming passivation layer on at least one copper conductive element in a semiconductor structure according to claim 7, wherein said diffusion barrier layer deposited is a silicon nitride layer.

9. A method for forming passivation layer on at least one copper conductive element in a semiconductor structure according to claim 1 further comprising the step of planarizing said top surface of the semiconductor device by a chemical mechanical polishing method.

* * * * *